US010110235B2

(12) United States Patent
Ferrant

(10) Patent No.: US 10,110,235 B2
(45) Date of Patent: Oct. 23, 2018

(54) LOOK-UP TABLE ARCHITECTURE

(71) Applicant: Soitec, Crolles (FR)

(72) Inventor: Richard Ferrant, Esquibien (FR)

(73) Assignee: SOITEC, Bernin (FR)

(*) Notice: Subject to any disclaimer, the term of this patent is extended or adjusted under 35 U.S.C. 154(b) by 0 days.

(21) Appl. No.: 14/381,544

(22) PCT Filed: Feb. 22, 2013

(86) PCT No.: PCT/EP2013/053568
§ 371 (c)(1),
(2) Date: Aug. 27, 2014

(87) PCT Pub. No.: WO2013/131765
PCT Pub. Date: Sep. 12, 2013

(65) Prior Publication Data
US 2015/0035562 A1 Feb. 5, 2015

(30) Foreign Application Priority Data
Mar. 5, 2012 (FR) .................................... 12 52003

(51) Int. Cl.
*H03K 19/177* (2006.01)
*H03K 19/003* (2006.01)
*H03K 19/00* (2006.01)

(52) U.S. Cl.
CPC ... *H03K 19/17728* (2013.01); *H03K 19/0013* (2013.01); *H03K 19/00315* (2013.01); *H03K 19/17792* (2013.01); *H01L 2924/0002* (2013.01)

(58) Field of Classification Search
USPC .......................... 326/37–41, 44, 47, 49, 101
See application file for complete search history.

(56) References Cited

U.S. PATENT DOCUMENTS

| 6,205,077 B1 | 3/2001 | Ferrant |
| 7,019,557 B2 * | 3/2006 | Madurawe ......... H03K 19/1737 326/38 |
| 7,045,468 B2 * | 5/2006 | Liang ................ H01L 21/76232 257/E21.549 |

(Continued)

FOREIGN PATENT DOCUMENTS

| CN | 101136070 A | 3/2008 |
| CN | 102109973 A | 10/2011 |

(Continued)

OTHER PUBLICATIONS

International Search Report for International Application No. PCT/EP2013/053568 dated May 15, 201, 3 pages.

(Continued)

Primary Examiner — Minh D A
Assistant Examiner — James H Cho
(74) Attorney, Agent, or Firm — TraskBritt

(57) ABSTRACT

The present invention relates to a look-up table architecture and to an FPGA comprising the same. The look-up table architecture comprises a registers group comprising a plurality of registers configured to issue register signals, and a programmable logic comprising a plurality of pass gates configured to be controlled at least by the register signals, the registers group and the programmable logic forming a look-up table, wherein the pass gates are placed in a single direction.

20 Claims, 10 Drawing Sheets

(56) References Cited

U.S. PATENT DOCUMENTS

| | | |
|---|---|---|
| 8,325,506 B2 | 12/2012 | Mazure et al. |
| 8,384,425 B2 | 2/2013 | Mazure et al. |
| 8,432,216 B2 | 4/2013 | Mazure et al. |
| 8,455,938 B2 | 6/2013 | Nguyen et al. |
| 8,508,289 B2 | 8/2013 | Mazure et al. |
| 8,654,602 B2 | 2/2014 | Mazure et al. |
| 8,664,712 B2 | 3/2014 | Mazure et al. |
| 2002/0186044 A1* | 12/2002 | Agrawal ............ H03K 19/1737 326/41 |
| 2006/0139054 A1 | 6/2006 | Madurawe |
| 2007/0013413 A1* | 1/2007 | Chiang .............. H03K 19/0948 326/121 |
| 2008/0197879 A1* | 8/2008 | Leung ............... H03K 19/17728 326/44 |
| 2009/0243652 A1* | 10/2009 | Dorairaj ............... G11C 7/1006 326/38 |
| 2011/0133822 A1 | 6/2011 | Mazure et al. |
| 2011/0170327 A1 | 7/2011 | Mazure et al. |
| 2011/0215860 A1 | 9/2011 | Mazure et al. |
| 2011/0260233 A1 | 10/2011 | Nguyen et al. |
| 2012/0231606 A1 | 9/2012 | Nguyen et al. |
| 2014/0225648 A1 | 8/2014 | Mazure et al. |

FOREIGN PATENT DOCUMENTS

| | | |
|---|---|---|
| CN | 102221991 A | 10/2011 |
| EP | 2333833 A1 | 6/2011 |

OTHER PUBLICATIONS

Chinese First Office Action for Chinese Application No. 201380012893.5 dated Oct. 9, 2016, 9 pages.

Chinese Second Office Action for Chinese Application No. 201380012893.5 dated Apr. 26, 2017, 9 pages.

International Written Opinion for International Application No. PCT/EP2013/053568 dated Sep. 9, 2014, 8 pages.

\* cited by examiner

FIG. 2

| | C1 | C2 | C3 | C4 | C5 | C6 | C7 | C8 | C9 | C10 | C11 | C12 | C13 | C14 | C15 | C16 | C17 | C18 |
|---|---|---|---|---|---|---|---|---|---|---|---|---|---|---|---|---|---|---|
| | A | B | Y0 | Y1 | Y2 | Y3 | Y4 | Y5 | Y6 | Y7 | Y8 | Y9 | Y10 | Y11 | Y12 | Y13 | Y14 | Y15 |
| R1 | 0 | 0 | 0 | 1 | 0 | 0 | 0 | 1 | 0 | 0 | 1 | 1 | 0 | 1 | 0 | 1 | 1 | 1 |
| R2 | 0 | 1 | 0 | 0 | 1 | 0 | 0 | 1 | 1 | 0 | 0 | 0 | 1 | 1 | 1 | 0 | 1 | 1 |
| R3 | 1 | 0 | 0 | 0 | 0 | 1 | 0 | 0 | 1 | 1 | 0 | 1 | 0 | 1 | 1 | 1 | 0 | 1 |
| R4 | 1 | 1 | 0 | 0 | 0 | 0 | 1 | 0 | 0 | 1 | 1 | 0 | 1 | 0 | 1 | 1 | 1 | 1 |
| R5 | function | | 0 | $\overline{A+B}$ | $A+\overline{B}$ | $\overline{A}+B$ | $A\cdot B$ | $\overline{A}$ | $A\cdot\overline{B}+\overline{A}\cdot B$ | $A$ | $\overline{A\cdot\overline{B}+\overline{A}\cdot B}$ | $\overline{B}$ | $B$ | $\overline{A\cdot B}$ | $A+B$ | $\overline{\overline{A}\cdot B}$ | $\overline{A\cdot\overline{B}}$ | 1 |
| R6 | r0 | | 1 | 0 | 1 | 1 | 1 | 0 | 1 | 1 | 0 | 0 | 1 | 0 | 1 | 0 | 0 | 0 |
| R7 | r1 | | 1 | 1 | 0 | 1 | 1 | 0 | 0 | 1 | 1 | 1 | 0 | 0 | 0 | 1 | 0 | 0 |
| R8 | r2 | | 1 | 1 | 1 | 0 | 1 | 1 | 0 | 0 | 1 | 0 | 1 | 0 | 0 | 0 | 1 | 0 |
| R9 | r3 | | 1 | 1 | 1 | 1 | 0 | 1 | 1 | 0 | 0 | 1 | 0 | 1 | 0 | 0 | 0 | 0 |

(PRIOR ART)

(PRIOR ART)

LOOK-UP TABLE ARCHITECTURE

CROSS-REFERENCE TO RELATED APPLICATIONS

This application is a national phase entry under 35 U.S.C. § 371 of International Patent Application PCT/EP2013/053568, filed Feb. 22, 2013, designating the United States of America and published in English as International Patent Publication WO 2013/131765 A1 on Sep. 12, 2013, which claims the benefit under Article 8 of the Patent Cooperation Treaty and under 35 U.S.C. § 119(e) to French Patent Application Serial No. 1252003, filed Mar. 5, 2012, the disclosure of each of which is hereby incorporated herein in its entirety by this reference.

TECHNICAL FIELD

The present invention relates to the field of electronics, in particular, to the field of semiconductors.

BACKGROUND

For implementing functions within a semiconductor circuit, it is customary to use a multitude of standard cells in what is called an Application Specific Integrated Circuit (ASIC). This approach has the advantage of providing a compact solution, together with a fast speed of execution of the instructions. However, the realization of an ASIC requires a high level of investment, since an entire set of lithographic masks has to be developed. Additionally, once finalized, the ASIC morphology and functionality cannot be changed.

As an alternative and more flexible solution, Field-Programmable Gate Array (FPGA) circuits are used. In an FPGA cell, a plurality of registers is provided as well as logic resources. By appropriately setting the registers and the logic, any Boolean or sequential function can be implemented between any two or more inputs of the FPGA cell.

In particular, an FPGA cell usually contains one or more look-up tables for realizing the programmable logic functionality.

FIG. 9 illustrates such an exemplary look-up table 9000.

Look-up table 9000 receives two input signals A and B. The look-up table further comprises a plurality of registers 9101-9104. Depending on the logic values assigned to the registers, the look-up table 9000 will realize any Boolean function of the two input signals A and B.

In order to do so, look-up table 9000 comprises a plurality of pass gates 9201-9206 connected between the plurality of registers 9101-9104 and an output node OUT. The plurality of pass gates 9201-9206 are controlled by the input signals A and B and their respective negated versions $\overline{A}$ and $\overline{B}$. The negation of the input signal A and B is obtained by means of inverters 9301 and 9302, respectively, connected to input signal A and input signal B.

As a result of such construction, any Boolean function of the input signals A and B can be obtained, depending on the values assigned to registers 9101-9104.

For instance, assuming that the pass gates 9201-9206 are each realized by a single NMOS transistor, as illustrated, when the registers 9101-9104 are, respectively, set to the values 0, 1, 1 and 1, the function realized on the output node OUT by input signals A and B corresponds to an OR function. As an example, if input signal A is set at 1 while input signal B is set at 0, pass gates 9201, 9204 and 9206 will be conducting, while pass gates 9202, 9205 and 9203 will be open. In turn, this implies that the output of register 9103 will be connected to node 9402, which will be itself connected to the output node OUT. Accordingly, the output node OUT will be set at 1, corresponding to the result of the OR function of the input signal A and B being respectively set at 1 and 0.

In the following, a potential physical realization of a look-up table will be described with reference to FIGS. 10A and 10B.

FIG. 10A illustrates a possible layout 10000 of a look-up table. FIG. 10B illustrates an enlarged portion of FIG. 10A.

In FIG. 9, for ease of representation, each of the pass gates 9201-9206 has been realized by a single NMOS transistor. However, in practice, a complementary CMOS couple of NMOS and PMOS transistors are generally used for each pass gate. Accordingly, the layout 10000 of FIG. 10A illustrates the case in which each pass gate is realized by a CMOS couple of transistors. It will be appreciated by those skilled in the art that the functionality carried out by the look-up table of FIG. 9 and the look-up table of FIG. 10A is substantially equivalent.

In particular, as can be seen in FIG. 10A, layout 10000 comprises three regions 10100-10300. The three regions 10100-10300 are substantially similar to each other in that each of them comprises two NMOS transistors 10130, 10140, and two PMOS transistors 10110, 10120. Further, each of regions 10100-10300 operates based on two inputs signals A and B and their negated versions $\overline{A}$ and $\overline{B}$, two register signals and one output.

As can be seen in FIG. 10B, region 10100 comprises two PMOS transistors 10110 and 10120, and two NMOS transistors 10130 and 10140. Transistors 10110 and 10130 correspond to a CMOS implementation of pass gate 9201, while transistors 10120 and 10140 correspond to a CMOS implementation of pass gate 9202.

Black squares, such as square 10112, indicate connections to the drain or source of the transistors. The gates of transistors 10110-10140 are, respectively, gates 10111-10141. In the case of region 10100, the four gates 10111-10141 are respectively connected to input signals $\overline{A}$, A, A and $\overline{A}$. The gate connections for remaining regions 10200 and 10300 are indicated in FIG. 10A.

Connection lines 10150, 10160 and 10170 are provided in order to connect the drain/sources of the transistors 10110-10140 to either one of the register signals issued by registers 9101-9104 (not illustrated in FIGS. 10A and 10B), and/or to internal nodes of the look-up table, such as nodes 9401 and 9402 and/or to output node OUT.

In the case of region 10100, connection line 10150 connects register 9101 to transistors 10110 and 10130, acting as pass gate 9201, while connection line 10160 connects register 9102 to transistors 10120 and 10140, acting as pass gate 9202. At the same time, connection line 10170 connects the transistors 10110-10140 to internal look-up table node 9401.

A corresponding arrangement is provided for region 10200, realizing pass gates 9204 and 9205, and for region 10300, realizing pass gates 9203 and 9206.

The schematic of look-up table 9000 and its physical realization via the layout of FIG. 10A can be improved.

In particular, the output node OUT is directly connected to the registers 9101-9104 via the plurality of pass gates 9201-9206. Accordingly, it is necessary for the registers 9101-9104 to have a current drive capability high enough to drive the load on output node OUT. In turn, this implies that such a structure cannot be realized with small registers since they would lack the appropriate current driving capabilities.

In particular, small SRAM, small DRAM and registers realized using flash technology are generally not powerful enough for such constructions.

Moreover, the signal from each of the registers 9101-9104 to the output node OUT has to cross several pass gates among pass gates 9201-9206. This increases the propagation delay and, therefore, the operating frequency of the circuit.

Furthermore, each passage through a pass gate 9201-9206 reduces the strength of the signal. For instance, in the case of NMOS or PMOS pass gates, the voltage is reduced. More generally, the strength of the signal is reduced due to the parasitic ON resistance of the pass gate. This translates in a delay to establish the signal and/or sensitivity to the noise. It is, therefore, customary to insert repeaters in-between the pass gates 9201-9206. However, this further increases the delay, thereby further slowing down the operating frequency of the circuit.

Additionally, the arrangement of the regions 10100-10300 in a triangular layout, as illustrated in FIG. 10A, makes it difficult to achieve a compact and dense layout, when a plurality of look-up tables 9000 is to be integrated in a single circuit. This has effects on the costs of the FPGA, as well as the reliability, since an irregular layout provides more difficulty for manufacturing.

While this could be solved by placing the three regions in a straight line, this solution is not ideal as the resulting structure loses symmetry and speed, since one among regions 10100 and 10200 would be placed farther away from region 10300 than the other.

BRIEF SUMMARY

The present invention has been made with respect to the above-described problems.

In particular, it is an object of the present invention to realize a look-up table that can achieve fast operating frequencies and low power consumption on a small silicon area.

Such an approach is achieved by the present invention.

More specifically, the present invention can relate to a look-up table architecture comprising: a registers group comprising a plurality of registers configured to issue register signals; and a programmable logic comprising a plurality of pass gates configured to be controlled at least by the register signals; the registers group and the programmable logic forming a look-up table, wherein the pass gates are placed in a single direction.

Resulting from such approach, it is possible to realize a dense layout for the look-up table architecture.

In a further advantageous embodiment, each pass gate can be placed on a position substantially aligned with the register issuing the register signal controlling the pass gate.

As a result of such approach, it is possible to have a simple routing and a simple timing management of the connections for the register signals.

In a further advantageous embodiment, the registers can be placed on one side of the programmable logic.

With such approach, it is possible to share interconnections common to all registers, such as power interconnections, decode interconnections, etc.

In a further advantageous embodiment, the registers can be placed in a staggered manner on two sides of the programmable logic.

Resulting from such approach, it is possible to use registers having a pitch larger than the pitch of the pass gates.

In a further advantageous embodiment, the look-up table architecture can further comprise a plurality of registers groups and a plurality of programmable logics forming a plurality of look-up tables, wherein the plurality of look-up tables can be placed next to each other such that any programmable logic is separated from the neighboring programmable logic by at least one register group.

As a result of such approach, the look-up table architecture can be scaled to accommodate any number of look-up tables, while advantageously allowing a regular routing of the signals used for setting the registers.

In a further advantageous embodiment, the look-up table architecture can further comprise at least one standard cell block comprising a plurality of standard cells, wherein the standard cell block can be placed along at least one look-up table and/or at least one register group.

Resulting from such approach, it is possible to integrate standard cells within the look-up table architecture in a dense manner.

In a further advantageous embodiment, the look-up table architecture can further comprise a decoder unit configured to select one or more of the plurality of registers and a data unit configured to set a value within registers selected by the decoder unit.

By utilizing such approach, the programming of the behavior of the look-up table architecture can be achieved.

In a further advantageous embodiment, the look-up table architecture can further comprise a first metal level configured to realize connections to internal nodes of the programmable logic and/or decode connections for a registers group and/or power connections for a registers group, and a second metal level configured to realize data connections for a registers groups.

Resulting from such approach, it is possible to program and operate the look-up table architecture with only two metal levels.

In a further advantageous embodiment, at least one of the plurality of pass gates can comprise a double gate transistor, having a first gate and a second gate.

With such approach, it is possible to realize a dense layout.

In some advantageous embodiments, the double gate transistor can be an SOI transistor having a top gate and a bottom gate. The first gate can be the top gate and the second gate can be the bottom gate.

As a result of such approach, the look-up table can be realized with standard SOI technology. Additionally, by choosing the bottom gate as the second gate, a common second gate can be shared among plural pass gates.

In some advantageous embodiments, the double gate transistor can be a FINFET having at least two independent gates.

Resulting from such approach, it is possible to realize the look-up table in a compact manner without employing SOI transistors.

Additionally, the present invention can relate to an FPGA comprising at least one look-up table architecture in accordance with any of the previous embodiments.

As a result of such approach, an FPGA having a dense and/or regular layout can be obtained. This allows for simpler and cheaper manufacturing, as well as saving costs in integration and scalability of the FPGA, since the look-up table architecture can be scaled to any number of inputs.

Additionally, a related embodiment can relate to a look-up table comprising: a plurality of register signals; a plurality of inputs signals; at least one output signal; and a plurality of pass-gates, wherein at least a first pass gate of the plurality of pass gates is controlled by at least a first input signal of the plurality of input signals, and by at least a first register signal of the plurality of register signals, such that the register signal has priority over the input signal on the operation of the first pass gate.

By utilizing such approach, it is possible to realize a look-up table in which the register signals are not directly driving the output node, thereby making it possible to use small registers.

In a related embodiment, the first pass gate can be configured so as to:
be open when the first register signal has a first logic value independent of the logic value of the first input signal;
be open when the first register signal has a second logic value opposite to the first logic value, and the first input signal has the first logic value; and
be closed when the first register signal has the second logic value, and the first input signal has the second logic value.

With such approach, it is possible to control the pass gate by giving priority to the register signal over the input signal.

In a related embodiment, the plurality of pass gates can further comprise a second pass gate, and the first pass gate and the second pass gate can have a complementary behavior.

As a result of such approach, it is possible to connect the output to complementary signals, such as a high voltage signal and a low voltage signal, by means of the first pass gate and of the second complementary pass gate, respectively.

In a related embodiment, the first pass gate can be connected between a first node and the output signal and the second pass gate can be connected between a second node and the output signal. The first node can have a voltage level higher than the second node.

Resulting from such approach, it is possible to drive the output node via the first and second nodes, which may be designed so as to have high current driving capabilities, thereby allowing faster charging/discharging of the output signal.

In a related embodiment, the first pass gate can comprise a double gate transistor having a first gate and a second gate. The input signal can be connected to one of the first gate and the second gate, and the register signal can be connected to the other of the first gate and the second gate.

By utilizing such approach, it is possible to realize the pass gate with a compact structure.

In a related embodiment, the plurality of pass gates can be divided into groups. All of the pass gates from the same group can be controlled by the same register signal, each group being associated with a different one of the plurality of register signals. Each of the pass gates from the same group can be controlled by a different input signal, each group being associated with all of the plurality of input signals.

With such approach, the look-up table can be scaled to any number of input signals.

Furthermore, a related embodiment can relate to an FPGA comprising at least one look-up table in accordance with the embodiments above.

As a result of such approach, a compact FPGA can be realized. Furthermore, due to the dense layout, the costs can be reduced. Additionally, with the driving of the output signal by voltage nodes other than the register signals, fast operation can be ensured. Moreover, as a result of the possibility of realizing a regular layout, yield in manufacturing can be improved.

The invention will be hereinafter described in more detail by way of example using advantageous embodiments and with reference to the drawings. The described embodiments are only possible configurations in which the individual features may, however, as described above, be implemented independently of each other or may be omitted.

BRIEF DESCRIPTION OF THE DRAWINGS

Equal elements illustrated in the drawings are provided with equal reference signs. Parts of the description relating to equal elements illustrated in the different drawings may be left out. In the drawings:

FIG. 2 illustrates a schematic view of the behavior of the look-up table of FIG. 1;

DETAILED DESCRIPTION

Figure 1:
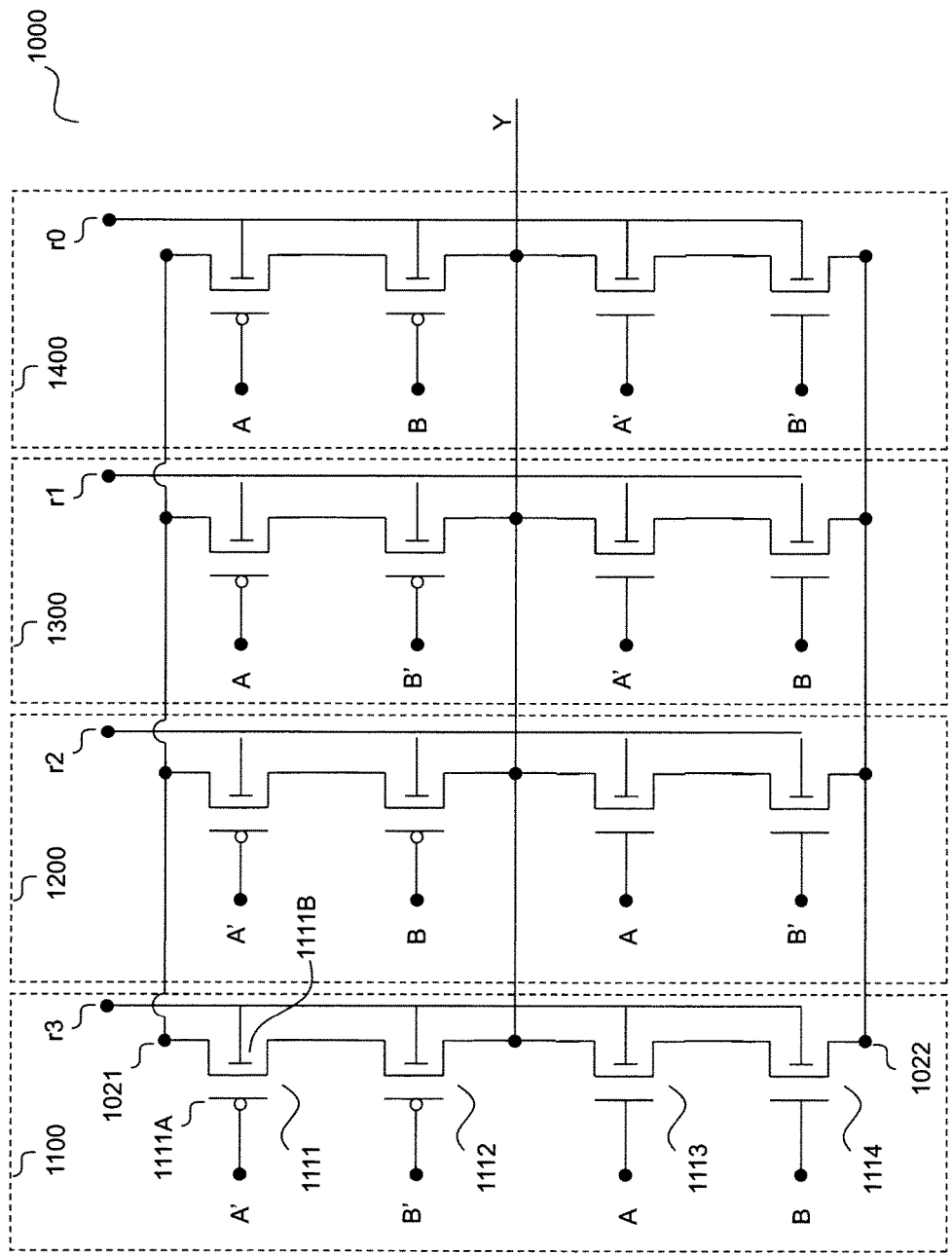
FIG. 1 illustrates a schematic view of a look-up table in accordance with an embodiment of the present invention.

As can be seen in FIG. 1, illustrating a schematic view of a look-up table 1000 in accordance with an embodiment of the present invention, look-up table 1000 receives two input signals A and B and their respectively negated versions A' and B', as well as a plurality of register signals r0-r3. Based on the values assigned to the plurality of register signals r0-r3, the look-up table 1000 allows the realization of any Boolean function of the input signals A and B, as will be described below.

Although not illustrated in the figure, it will be clear to those skilled in the art that input signals A, A', B and B' could be inputted, or that any of input signals A and B could be inputted and its negated version obtained by means of an inverter.

Additionally, although not illustrated in the figure, register signals may be provided by a plurality of registers that may be comprised within the look-up table 9000.

Additionally, look-up table 1000 provides an output signal Y. The value of the output signal Y depends on the Boolean function realized by the look-up table 1000, which is based on the values of the register signals r0-r3, and on the values of the input signals A and B, as it will be described below.

Look-up table 1000 comprises several pass gates. In particular, look-up table 1000 is modular and comprises four regions 1100-1400, each region comprising four pass gates 1111-1114. In the following, a description will be provided of region 1100. The remaining regions 1200-1400 are constructed in a substantially similar manner, except for their connections to the input signals and register signals, as indicated in FIG. 1.

Region 1100 comprises four pass gates 1111-1114. Pass gates 1111 and 1112 are connected between a high-voltage power supply 1021, and the output node Y. Pass gates 1113 and 1114 are connected between a low-voltage power supply 1022 and the output node Y.

The high voltage power supply 1021 could be, for instance, the power supply of the FPGA circuit, while the low voltage power supply 1022 could be, for instance, the ground node of the FPGA circuit. However, this is one example only and the present invention is not limited thereto. More generally, for the purpose of the embodiment illustrated in FIG. 1, it is sufficient that node 1021 has a higher voltage value than node 1022.

Each of the pass gates 1111-1114 is controlled by two signals.

In particular, in the present embodiment, each of the pass gates 1111-1114 is realized by one double gate transistor having a first gate 1111A and a second gate 1111B. However, the present invention is not limited thereto and any structure that realizes the functionality of the pass gates 1111-1114 as described below, can be used instead of a double gate transistor.

FIG. 1 represents a specific embodiment in which the double gate transistors acting as pass gates 1111-1114 are realized in SOI technology. However, the present invention is not limited thereto and the double gate transistors can be realized with any technology providing a transistor having a plurality of independent gates, such as FINFETs.

As can be seen in FIG. 1, the first gate 1111A of each of double gate transistors realizing pass gates 1111-1114 is connected to one input signal among input signals A, B, and their negated versions A' and B'. On the other hand, all of the second gates 1111B of region 1100 are connected to register signal r3.

Even more specifically, the first gate 1111A of double gate PMOS transistor, acting as pass gate 1111, is connected to the input signal A', while the second gate 1111B is connected to the register signal r3. The first gate 1111A of double gate PMOS transistor, acting as pass gate 1112, is connected to the input signal B', while the second gate 1111B is connected to the register signal r3. The first gate 1111A of double gate NMOS transistor, acting as pass gate 1113, is connected to the input signal A, while the second gate 1111B is connected to the register signal r3. Finally, the first gate 1111A of double gate NMOS transistor, acting as pass gate 1114, is connected to the input signal B, while the second gate 1111B is connected to the register signal r3.

The connections of the pass gates 1111-1114 of the regions 1200-1400 differ from those of region 1100, due to the signals being inputted to each of the pass gates, as illustrated. Generally, in all regions, the output node Y is connected between pass gates 1112 and 1113. Still generally, the low voltage node 1022 is common to all regions, as well as the high voltage node 1021. Additionally, the second gate of double gate transistors, acting as pass gates 1111-1114, is connected to a single register signal r2-r0 for, respectively, regions 1200-1400.

The behavior of each of the pass gates 1111-1114 will now be described with reference to a PMOS double gate transistor, such as for the one acting as pass gates 1111 and 1112. It will be clear to those skilled in the art that a pass gate implemented by a double gate NMOS transistor, such as the one acting as pass gates 1113 and 1114, has a complementary behavior.

Double gate PMOS transistors realizing pass gates 1111 and 1112 are such that their behavior is primarily dictated by their second gate 1111B, connected to register signal r3, and secondarily by their first gate 1111A, connected, respectively, to input signals A and B.

More specifically, when the second gate 1111B of PMOS double gate transistors acting as pass gate 1111 or 1112 is connected to a high logic signal having a logic value of 1, the PMOS transistor will be open, i.e., not conducting, independently of the value applied on its first gate 1111A. On the other hand, when the second gate 1111B is set at a low logic value having a logic value of 0, the transistor will be closed, i.e., conducting, if the first gate 1111A is set at a low logic value of 0, while it will be open, i.e., not conducting, if the first gate 1111A is set at a high logic value of 1.

In other words, when the second gate 1111B is set at a high logic value of 1, the transistor is always open, while the transistor behaves as a standard single-gate PMOS transistor when the signal on the second gate 1111B is set at a low logic value of 0. That is, the second gate 1111B has priority over the first gate 1111A on the operation of the pass gate.

It will be appreciated by those skilled in the art that, although the embodiment of FIG. 1 illustrates the front gate and the back gate of the double gate transistors 1111-1114 as being, respectively, the first gate 1111A and the back gate 1111B, the present invention is not limited thereto. Alternatively, the top gate and the back gate could, respectively, be the second gate 1111B and the first gate 1111A.

Moreover, although the pass gates 1111-1114 have been described as each being realized by a double-gate transistor, in particular, an SOI double gate transistor or a FINFET, the present invention is not limited thereto and could be realized with any technology allowing the above-described behavior. This could be achieved, for instance, by any transistor having at least two independent gates. Even more generally, such behavior could be achieved by an electronic component or an electronic circuit with at least two inputs, acting as a pass gate 1111 and/or 1112 being:

open when a first of the two inputs is at a logic value of 1, independently of the value of the second input, open when the first of the two inputs is at a low logic value of 0, if the second input is at a high logic value of 1, and closed when the first of the two inputs is at a low logic value of 0, if the second input is at a low logic value of 0.

It will be appreciated by those skilled in the art that such a behavior can be realized in several manners, the double-gate SOI transistor illustrated in FIG. 1 being only a mere example of such behavior.

It will also be appreciated that, for the complementary pass gate 1113 and/or 1114, a complementary behavior can be realized such that the pass gate is:

open when a first of the two inputs is at a logic value of 0, independently of the value of the second input, open when the first of the two inputs is at a high logic value of 1, if the second input is at a low logic value of 0, and closed when the first of the two inputs is at a high logic value of 1, if the second input is at a high logic value of 1.

FIG. 2 illustrates a schematic view of the behavior of the look-up table 1000 of FIG. 1.

In particular, values in columns C1-C2 and rows R1-R4 illustrate all four possible combinations of input signals A and B. The values of the respectively negated signals are not illustrated, for ease of representation. Rows R6-R9 and columns C3-C18 illustrate all possible combinations of the register signals r0-r3. Row R5 illustrates, for each of columns C3-C18, the Boolean function realized by setting the register signals r0-r3 at the values in the corresponding column. The values in rows R1-R4 and columns C3-C18 illustrate the output value on node Y resulting from the respective combination of register signals r0-r3 for the same column, and input signals A and B for the same row.

As an example, by setting the register signals r0-r3 at, respectively, 1, 1, 1 and 0, as in column C7, the output signal on node Y of the look-up table 1000 will be Y=0, for A=0 and B=0, Y=0, for A=0 and B=1, Y=0, for A=1 and B=0, and Y=1, for A=1 and B=1. This corresponds to an AND function between input signals A and B, as illustrated in Row R5, column C7. This particular case will now be described.

By setting signals r0-r3 at, respectively, 1, 1, 1, and 0, as indicated in column C7, PMOS transistors acting as pass gates 1111 and 1112 of regions 1200, 1300 and 1400 will be open, independent of the value of input signals A and B. That is because the second gate 1111B is dominant over the first gate 1111A, as described above. Similarly, NMOS transistors acting as pass gates 1113 and 1114 of region 1100 will be open, independent of the value of input signals A and B.

Only if both signals A and B are set at 1, the pass gates 1111 and 1112 of region 1100 will be conducting. At the same time, for this combination, at least of one of pass gates 1113 and 1114 will be open, i.e., non-conducting. In particular, in region 1110, they will be both open due to the setting of signal r3 at 0. In the remaining regions, at least one of the two pass gates is connected to input signal A'=0 and/or B'=0 and is, therefore, open. Accordingly, the output node Y is set at a high logic value resulting from the connection of output node Y to the high voltage power supply 1021.

Schematically, for the remaining combinations:
A=0, B=0: pass gates 1113 and 1114 in region 1400 will be both conducting;
A=0, B=1: pass gates 1113 and 1114 in region 1300 will be both conducting; and
A=1, B=0: pass gates 1113 and 1114 in region 1200 will be both conducting.

This implies that, in these cases, the output node Y will be set at a low logic value, resulting from the connection of output node Y to the low voltage power supply 1020.

A look-up table in accordance with the present embodiment provides several advantages.

As illustrated in FIG. 2, the look-up table 1000 provides all Boolean function of the input signals A and B, depending on the values set on register signals r0-r3.

Additionally, the look-up table 1000 allows the output node Y to be driven by the high-voltage power supply node 1021 or the low voltage power supply node 1022. This allows the signal Y to be driven quickly and with the appropriate current capabilities.

This is further particularly advantageous, since the signal on the output Y is not driven by a register signal r0-r3. On the other hand, each of the register signals r0-r3 is only connected to a capacitive load, consisting of the second gate 1111B of double gate transistors acting as pass gates 1111-1114. Accordingly, smaller registers can be used to generate the signals r0-r3, in particular, small DRAM/SRAM registers and/or flash registers. This is also the case when the pass gates 1111-1114 are realized by an equivalent circuit, since the input of a digital circuit is usually a capacitive load.

Figure 9:
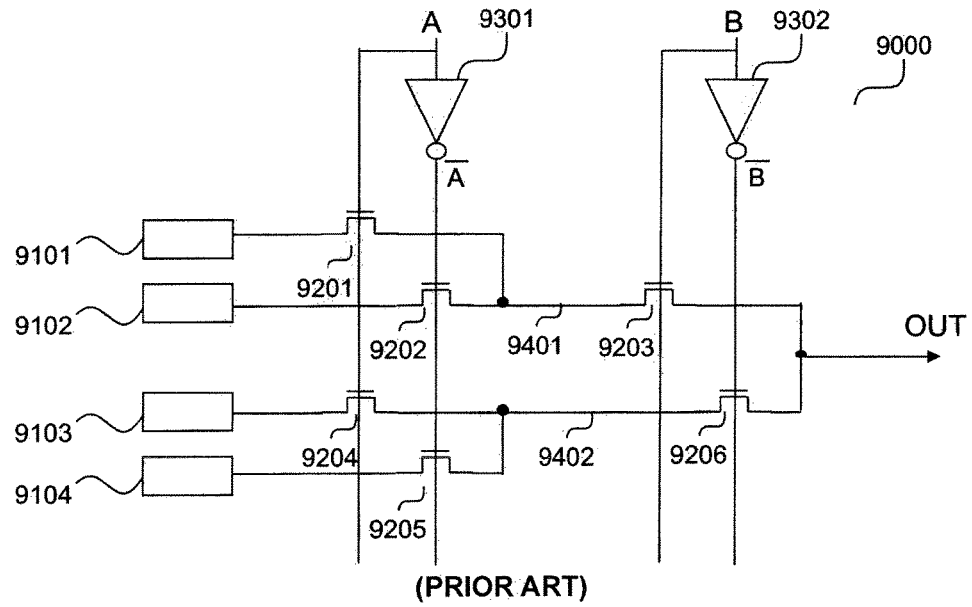
FIG. 9 illustrates an exemplary look-up table.

Still additionally, the timing of the look-up table 1000 is simply managed, since any of input signals A and B and their respective negated versions A' and B' has the same load. The same is also valid for each of register signals r0-r3. This is in contrast to the case of FIG. 9, in which signal A has a larger load than signal B, thereby rendering the timing of the circuit more complex to manage.

Figure 3:
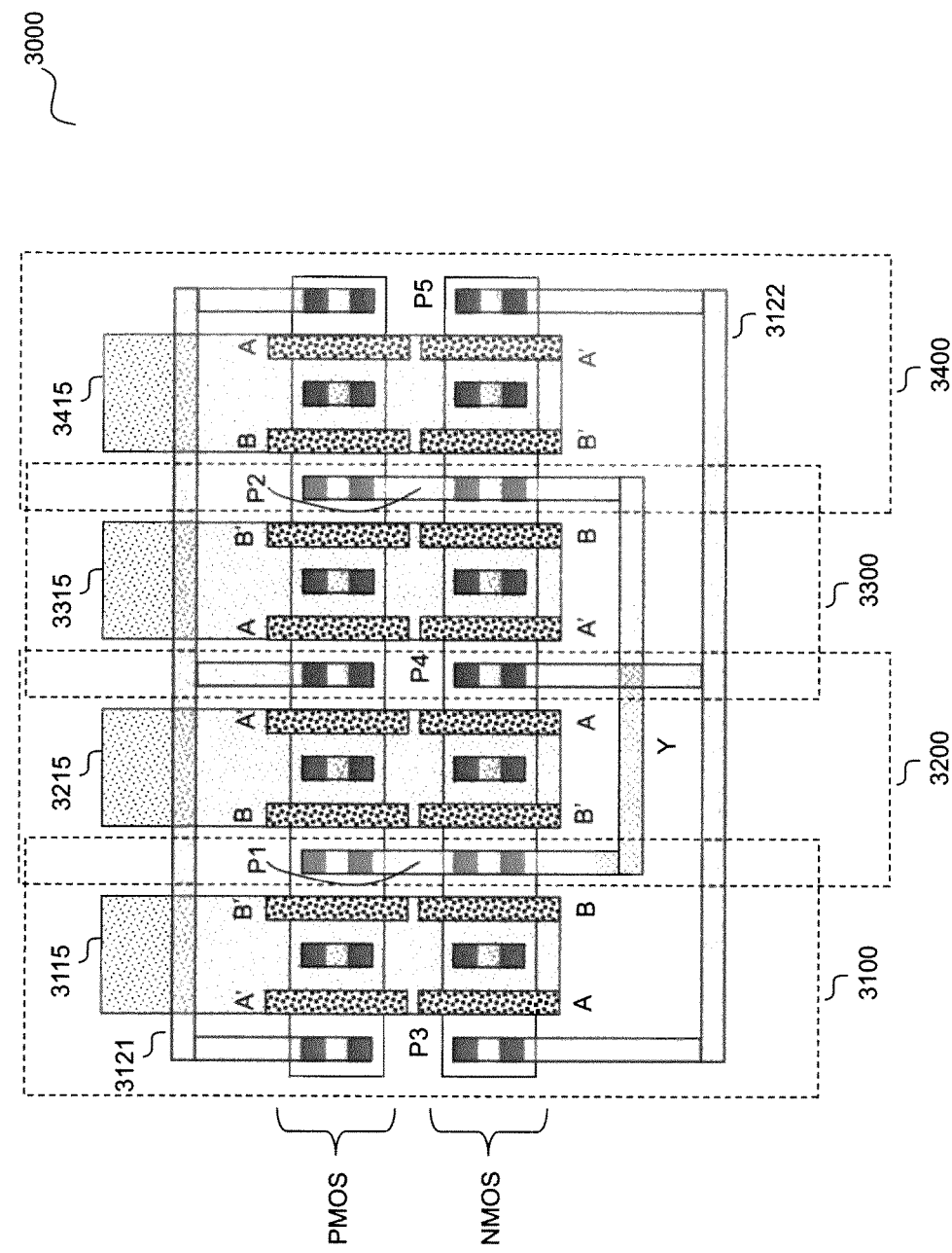
FIG. 3 illustrates a schematic layout of the look-up table of FIG. 1, in accordance with an embodiment of the present invention.

FIG. 3 illustrates a schematic layout 3000 of the look-up table 1000 of FIG. 1, in accordance with an embodiment of the present invention.

The layout 3000 is divided into regions 3100-3400, functionally corresponding to regions 1100-1400 of look-up table 1000 of FIG. 1, respectively. In the following, a detailed description will be given of region 3100. It will be appreciated by those skilled in the art that regions 3200-3400 are functionally similar.

Region 3100 comprises two PMOS transistors having on their first gate 1111A signals A' and B', respectively, from left to right. Those correspond to pass gates 1111 and 1112 of FIG. 1. Similarly, region 3100 comprises two NMOS transistors having on their first gate 1111A signals A and B, respectively, from left to right, corresponding to pass gates 1113 and 1114 of FIG. 1.

Although not illustrated, for ease of understanding, first gates 1111A are physically connected to connection lines providing the respective signal. In the figure, for ease of understanding, only the signal is indicated next to the respective gate.

Moreover, region 3100 has a high voltage connection 3121, corresponding to high voltage node power supply 1021, shared with remaining regions 3200-3400 of layout 3000. Similarly, region 3100 has a low voltage connection 3122, corresponding to low voltage power supply node 1022, shared with remaining regions 3200-3400 of layout 3000.

Although not illustrated, connections 3121 and 3122 may be further connected to other nodes outside of layout 3000.

Region 3100 further comprises a second gate 3115, functionally corresponding to second gate 1111B of transistors acting as pass gates 1111-1114 of region 1100 of FIG. 1. Although in FIG. 3 the second gate 3115 is illustrated as a single geometric element, the present invention is not limited thereto. Alternatively, or in addition, the shape of the second gate 3115 could be changed as needed, as long as an effective control over double gate transistors acting as pass gates 1111-1114 is achieved.

Figure 5:
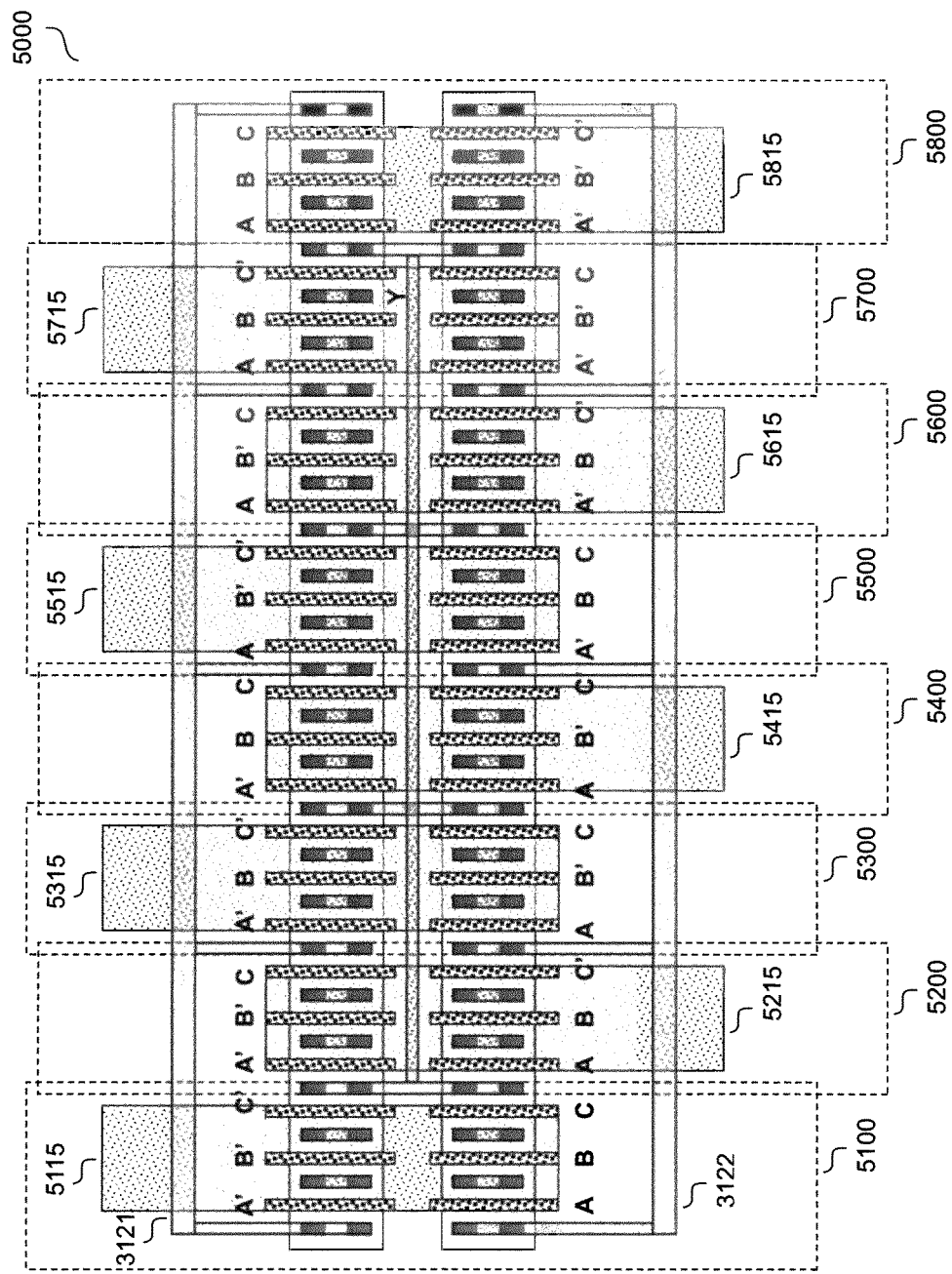
FIG. 5 schematically illustrates a layout, representing a possible implementation of look-up table of FIG. 4, in accordance with an embodiment of the present invention.

Corresponding second gates 3215-3415 in regions 3200-3400 are all illustrated as extending toward the upper part of regions 3100-3400. This may be beneficial, in certain cases, as it allows the placement of the connections to the registers and/or the registers themselves providing register signals to the second gates 3215-3415, in a straight-line arrangement. However, the present invention is not limited thereto and the registers could be connected to the second gates 3115-3415 on the bottom and/or on the top of regions 3100-3400. In this respect, an alternative staggered approach is illustrated in FIG. 5.

Layout 3000 further comprises a connection Y, corresponding to output node Y of FIG. 1.

As can be seen in FIG. 3, by advantageously placing the transistors of regions 3100-3400, it is possible to connect connection Y to the output of all four regions 3100-3400, by having a physical connection in only two points: point P1 shared between regions 3100, 3200, and point P2 shared between regions 3300, 3400.

Although in the present embodiment connection Y requires a layer different from low voltage connection 3122 due to their overlap, the present invention is not limited thereto. Alternatively, or in addition, the connection Y could be realized in between the first gates 1111A of the transistors of regions 3200 and 3300, as illustrated, for instance, in FIG. 5.

Additionally, by advantageously placing the transistors, it is possible to connect both high voltage connection 3121 and low voltage connection 3122 to all four regions by using a physical connection in only three points: point P3 in region 3100, point P5 in region 3400 and point P4 shared among regions 3200 and 3300.

Moreover, the layout 3000 is advantageous since all transistors can be placed in a single row, achieving a compact and dense design. Furthermore, the structure is highly regular, providing advantages in terms of manufacturing and managing of timings.

Figure 4:
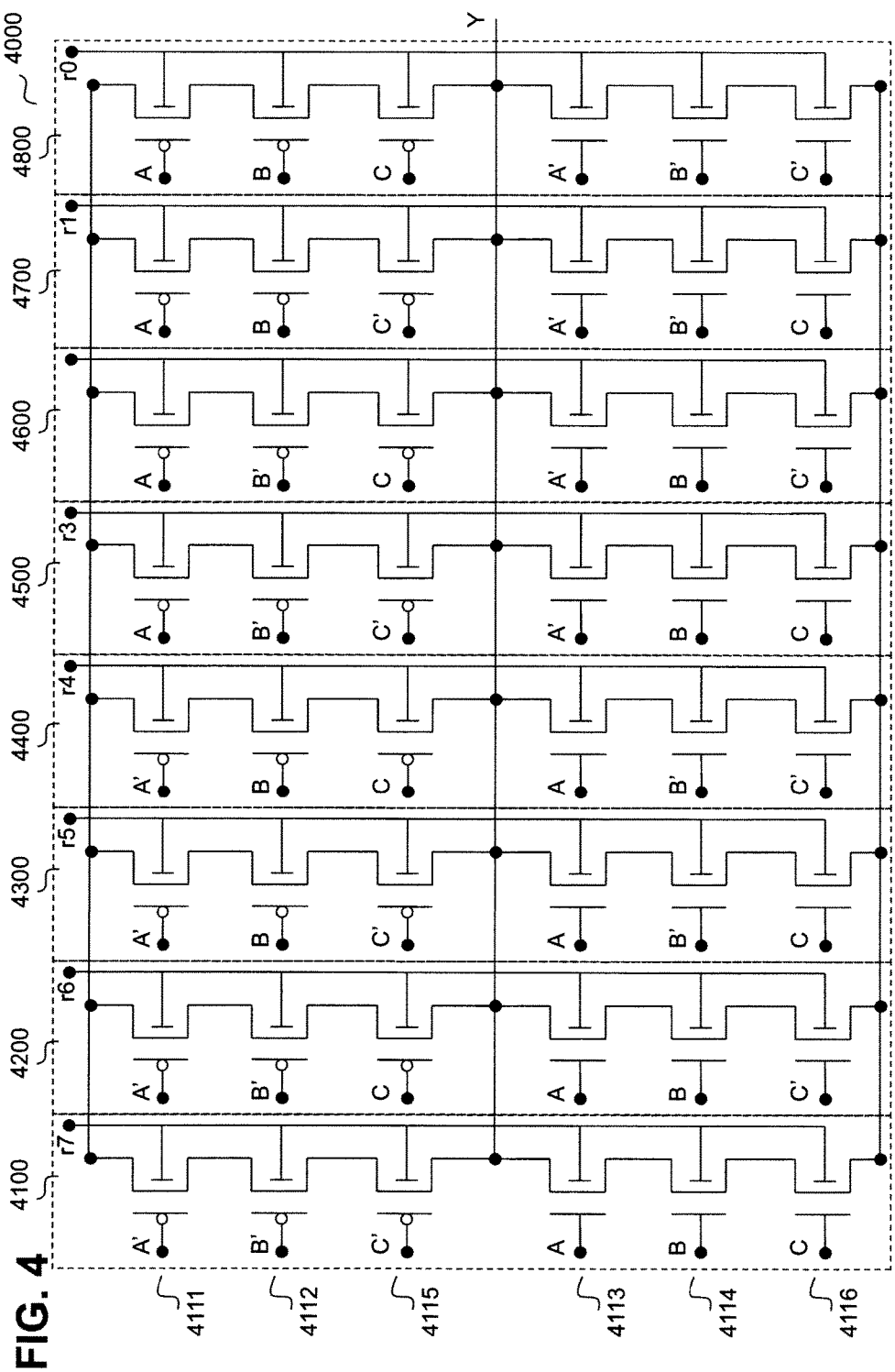
FIG. 4 schematically illustrates a further embodiment of a look-up table, in accordance with the present invention.

FIG. 4 schematically illustrates a further embodiment of a look-up table 4000, in accordance with the present invention.

In particular, the look-up table 4000 of FIG. 4 is based on the look-up table 1000 of FIG. 1, but is expanded in order to work on three input signals A, B, C and their respectively negated versions A', B', and C'.

Similar to look-up table 1000, look-up table 4000 is comprised of a plurality of substantially similar regions 4100-4800. Each of the regions 4100-4800 comprises a plurality of pass gates 4111-4116, each of the pass gates 4111-4116 having a connection to a different one among input signals A, B, C and their respectively negated versions A', B', and C' on their first gate 1111A. At the same time, each of the pass gates 4111-4116 shares a common connection to a single register signal r7.

As can be seen in FIGS. 1 and 4, it is possible to realize a look-up table in accordance with an embodiment of the present invention having as many input signals as needed. In particular, given N input signals, the corresponding look-up table will have $2^n$ register signals $r_0$-$r_{n-1}$ and will have 2N pass gates in each of the $2^n$ regions.

Such structure is advantageous since the output Y is always driven by the high voltage power supply 1021 and low voltage power supply 1022, thereby ensuring proper driving of the output node, independent of the number of input signals.

Additionally, even with a high number of input signals, the register signals are still only connected to a capacitive load, which allows using registers having small current capabilities, as detailed above, even for a large number of input signals.

FIG. 5 schematically illustrates a layout 5000, representing a possible implementation of lookup table 4000 of FIG. 4, in accordance with an embodiment of the present invention.

Layout 5000 comprises eight regions 5100-5800 similar to each other. Similar to layout 3000 of FIG. 3, layout 5000 comprises a high voltage connection 3121 and a low voltage connection 3122 common to all regions 5100-5800. Moreover, a single connection Y acting as output node Y of FIG. 4 is present.

Additionally, layout 5000 comprises eight second gates 5115-5815 connected to register signals r7-r0, respectively. As an alternative to FIG. 3, the second gates 5115-5815 are organized in a staggered placement. This may be useful, for instance, if the width of the register is such that they have a pitch larger than that of regions 5100-5800.

Although in the above embodiments all pass gates 1111-1114 and 4111-4116 have been described as having two inputs, the present invention is not limited thereto.

As an example, with reference to FIG. 1, pass gates 1111 and 1113 could be realized with a single input connected to the input signal only. For instance, at least one of pass gates 1111 and 1113 of region 1100 could be a single-gate transistor having a first gate 1111A connected to input signal A' and A, respectively. This may be advantageous in providing a smaller load to the register signals, as well as simplifying the layout in certain cases. In general, the invention can be implemented if at least one of the pass gates in series between each power supply node and the output node, for each region, has the previously described behavior.

Moreover, an alternative to three-input signal look-up table 4000 could be realized by using a two-input look-up table 1000 of FIG. 1 twice. In particular, this provides the advantage that the number of pass gates of the combination of two two-input look-up tables 1000 is 32, while the number of pass gates of the three-input look-up table 4000 is 48.

Figure 10A:
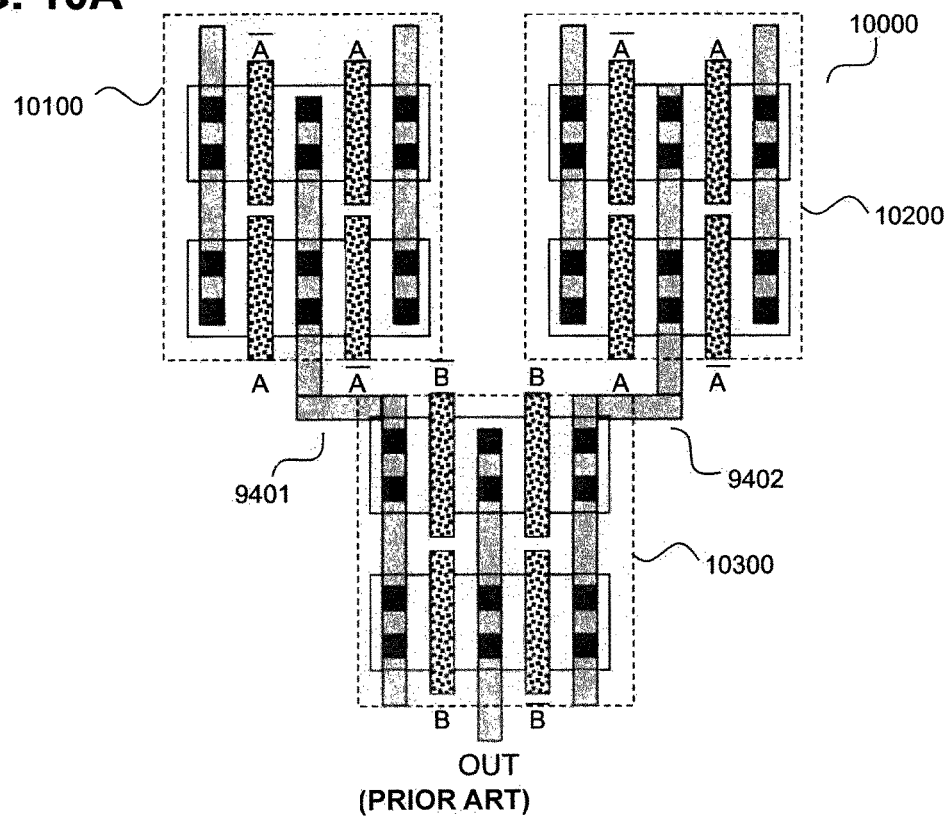
FIG. 10A illustrates a possible layout of the look-up table of FIG. 9.
Figure 10B:
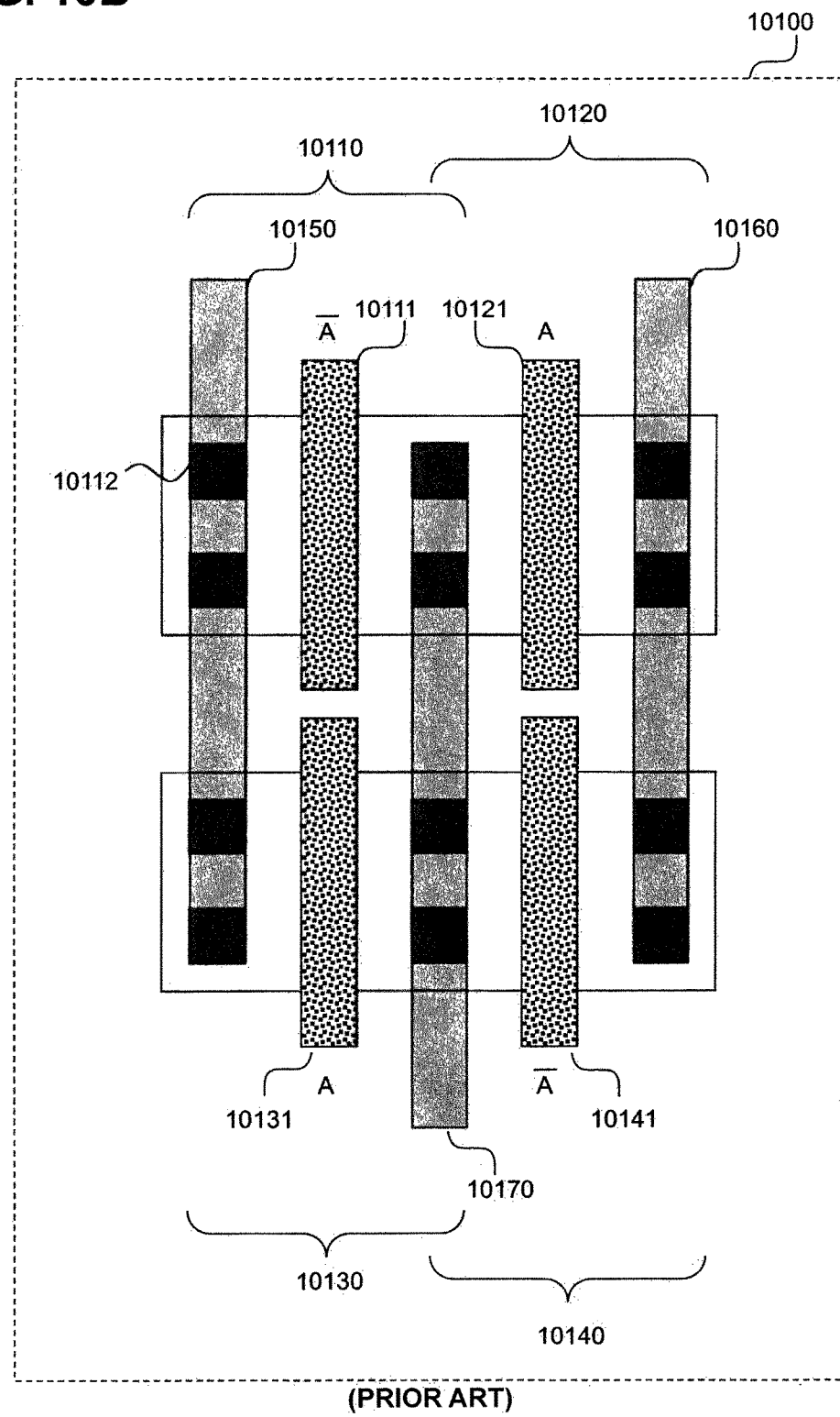
FIG. 10B illustrates an enlarged portion of FIG. 10A.

In both cases, the extreme regularity of the layout compensates for the additional number of transistors required compared to the solution of FIG. 10A. For instance, in FIG. 10A, there are distances between blocks 10100 and 10200 and 10300, which are not present in the embodiments of FIGS. 1-8. Moreover, in both cases, since the look-up table is powered by the high voltage power supply and the low voltage power supply, the transistors of the embodiments of FIGS. 1-8 operate in a better regime than the transfer gate cases of FIG. 9 so they can be reasonably smaller. Moreover, the register signals do not provide the power to the output of the look-up table. The logic that generates the signal for the register signals can be considerably reduced in area in the case of flip-flops. In the case of the Flashes register, there is no need for the sense amplifier to transform the stored value into a powered signal, which provides a considerable gain in terms of silicon area.

Figure 6:
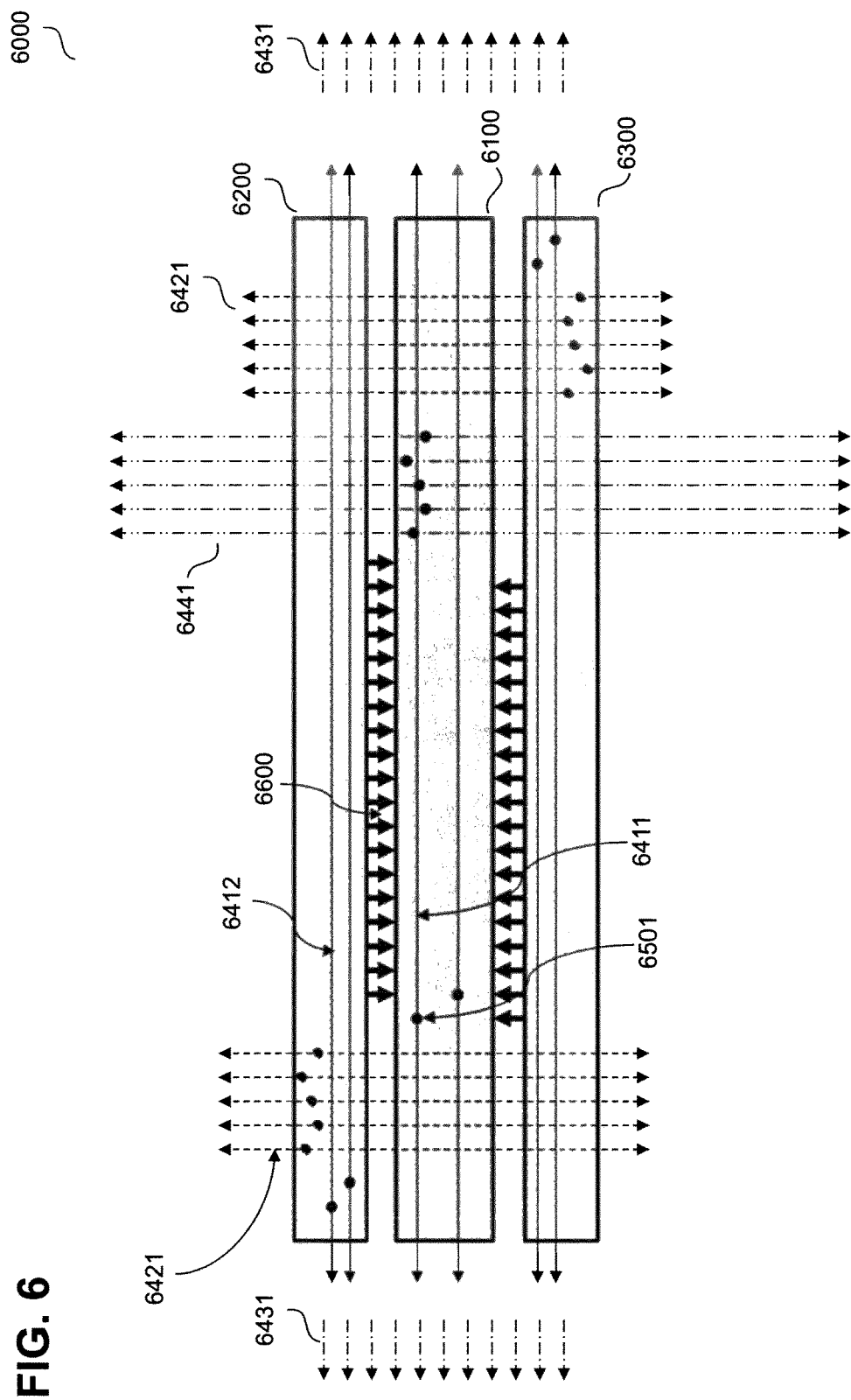
FIG. 6 schematically illustrates a look-up table in accordance with a further embodiment of the present invention.

FIG. 6 schematically illustrates a look-up table architecture 6000 in accordance with a further embodiment of the present invention.

Look-up table architecture 6000 comprises a programmable logic part 6100 and registers groups 6200 and 6300. In particular, the programmable logic part 6100 is realized in accordance with any of the embodiments described with reference to look-up tables 1000, 3000, 4000 and 5000 of FIGS. 1, 3, 4 and 5. Similarly, the registers groups 6200 and/or 6300 correspond to a group of registers, not illustrated, providing the register signals such as r0-r3 in FIGS. 1 and 3 and r0-r7 in FIGS. 4 and 5.

As illustrated in FIGS. 1, and 3-5, it is possible to place pass gates 1111-1114, 4111-4116 in a single direction, in particular, next to each other, although they may be separated by the introduction of additional transistors and/or other electronic elements such as ESD protection circuits. In particular, with reference to FIGS. 1 and 3, PMOS pass gates are placed in a single row in the order: 1111, 1112, from region 1100; 1112, 1111 from region 1200; 1111, 1112 from region 1300; and 1112, 1111 from region 1400. The respective complementary NMOS transistors are also placed in order in a single row: 1113, 1114, from region 1100; 1114, 1113 from region 1200; 1113, 1114 from region 1300; and 1114, 1113 from region 1400.

When the pass gates are realized with an NMOS technology only, or a PMOS technology only, all pass gates can be realized in a single direction, on a single row.

When a CMOS architecture is used, the presence of two rows of transistors can be functionally interpreted as a single row of complementary pass gates. In other words, a single row placement is effectively realized for the pass gates when each couple of CMOS pass gates is considered as a single functional unit. For instance, pass gates 1111 and 1113, having a complementary behavior, can be considered as a single functional pass gate.

As a result of the placement of all pass gates in a single direction, it is possible to efficiently combine the programmable logic part 6100 and the registers groups 6200 and 6300 in a dense manner. In fact, such placement of the pass gates allow the register to be placed near the pass gates, thereby avoiding complex routing and empty silicon areas.

In the following, the placement of, and the connection between, the programmable logic part 6100 and the registers groups 6200 and 6300 will be described.

Metal 1 connection lines, such as connection line 6411, provide connections 6501 to the internal nodes of the programmable logic 6100, such as power supplies, i.e., high voltage power supply node 1021 and/or low voltage power supply node 1022, and/or internal interconnections to the input signals, and/or connection to the output node Y, etc.

For ease of illustration, only connection 6501 has been referenced. It will be clear to those skilled in the art that other exemplary connections are similarly indicated with circular dots in FIG. 6. Additionally, the number and placement of connection lines, such as line 6411, is indicated as exemplary only and will depend, among others, on the position and number of physical nodes to which connection is required, and/or on the size of the programmable logic 6100 and registers groups 6200, 6300.

Alternatively, or in addition, metal 1 connection lines, such as connection line 6412, provide decode connections for registers groups 6200 and/or 6300. For instance, connection line 6412 can be used in order to decode, i.e., select, one or more registers from registers group 6200. By selecting the register, it is possible, for instance, to store one value within the register, so as to configure the look-up table architecture 6000.

Alternatively, or in addition, metal 1 connection lines provide power connections for registers groups 6200 and/or 6300.

The placement of the programmable logic 6100 along the registers groups 6200 and/or 6300, therefore, advantageously allows a single metal level, in this case, metal 1, to be used both for realizing connections within the programmable logic 6100 and within the registers groups 6200 and/or 6300.

Additionally, such a placement allows the connections 6600 from the registers groups 6200 and 6300 to the programmable logic 6100 to propagate the register signals with a simple routing. That is, register signals r0-r3, r0-r7, outputted by registers within registers groups 6200, 6300, can be connected to nodes r0-r3, r0-r7, of FIGS. 1, 3-5. Connections 6600 can be realized in the metal level 1 or 2, or in a polysilicon level, or an equivalent connection level below the metal levels.

In particular, it is possible to place the registers in a manner substantially aligned with the respective pass gates. For instance, with reference to FIG. 5, it is possible to place the register issuing register signal r7 substantially above second gate 5115; register issuing register signal r6 substantially above second gate 5215; register issuing register signal r5 substantially above second gate 5315, etc. This provides a simple routing for the register signals and a scalable design.

In FIG. 5, the second gates 5115-5815 are routed such that the registers would be placed in a staggered manner, thereby realizing registers group 6200 including registers issuing register signals r7, r5, r3 and r1, and registers group 6300 including registers issuing register signals r6, r4, r2 and r0.

However, the present invention is not limited thereto and the registers can all be placed in a single registers group, such as registers group 6200, when using the routing for second gates 3115-3415 illustrated in FIG. 3.

Additionally, the staggered approach is not limited to one register above the programmable logic 6100 and one register below, etc. Any combination could be used, for instance, two registers above and two registers below; one register above and two below, etc. In particular, if the registers are designed so that they can be effectively grouped in groups of two, it may be advantageous to place them two above the programmable logic, two below, two above, and so on.

A further metal level, metal 2, is used for connection lines, such as connection line 6421, to provide data connections for registers groups 6200 and/or 6300. For instance, connection line 6421 can be used once one or more registers from registers group 6200, 6300 have been selected in order to set a given data value to the register so as to configure the look-up table architecture 6000.

Resulting from the above-described two levels of metal, the operation of the look-up table architecture is achieved. More specifically, by using only two metal levels, it is possible to program the registers so as to program the behavior of the look-up table architecture 6000, and to provide power to the look-up table.

Connection line 6431 and/or 6441 can, therefore, be used to interconnect internal nodes of programmable logic 6100 to other nodes in the nearby circuit. For instance, it can be used to connect input signals A, B, C, A', B', C' of the look-up table 4000 acting as programmable logic 6100 to inputs of the circuit including look-up table architecture 6000. Alternatively, or in addition, it can be used to connect the output of the look-up table 4000 acting as programmable logic 6100 to the output of the circuit including look-up table architecture 6000. Still alternatively, or in addition, it can be used to connect to other nodes, such as nodes of another look-up table architecture 6000.

Connection line 6431 can be realized on metal 1, or any metal other than metal 2, due to the crossing with connection line 6421 in metal 2. Symmetrically, connection line 6431 can be realized on metal 2, or any metal other than metal 1, due to the crossing with connection line 6411 in metal 1.

Such an arrangement for look-up table architecture 6000 is advantageous as it is regular, thereby simplifying routing, timings, parasitic capacitances management, manufacturing, error detections, and scalability.

Although the present embodiment has been illustrated as including two registers groups 6200 and 6300, the present invention is not limited thereto. In particular, the invention can also be realized with a single group of registers, such as registers group 6200 only, as described above. Alternatively, or in addition, one or more further registers groups, placed above registers group 6200 and/or below registers group 6300, could be implemented. For instance, the registers could be provided in a staggered manner, but all on one side of the programmable logic 6100, resulting in registers groups 6200 and 6300 being one above the other.

Furthermore, although the embodiment has been illustrated with reference to horizontal placement for odd metal lines and vertical placement for even metal lines, this is an example only. Alternatively or in addition, the directions of the metal lines could be opposite, that is, horizontal placement for even metal lines and vertical placement for odd metal lines. Still alternatively or in addition, all metal lines could be either horizontal or vertical. In general, any metal line can have any directivity, such as horizontal, vertical, 45 degrees, etc.

Additionally, although metal levels have been described as metal 1, metal 2, etc., this is not limiting the present invention. More specifically, any metal level could be swapped with any other, as it will clearly appear to those skilled in the art.

Figure 7:
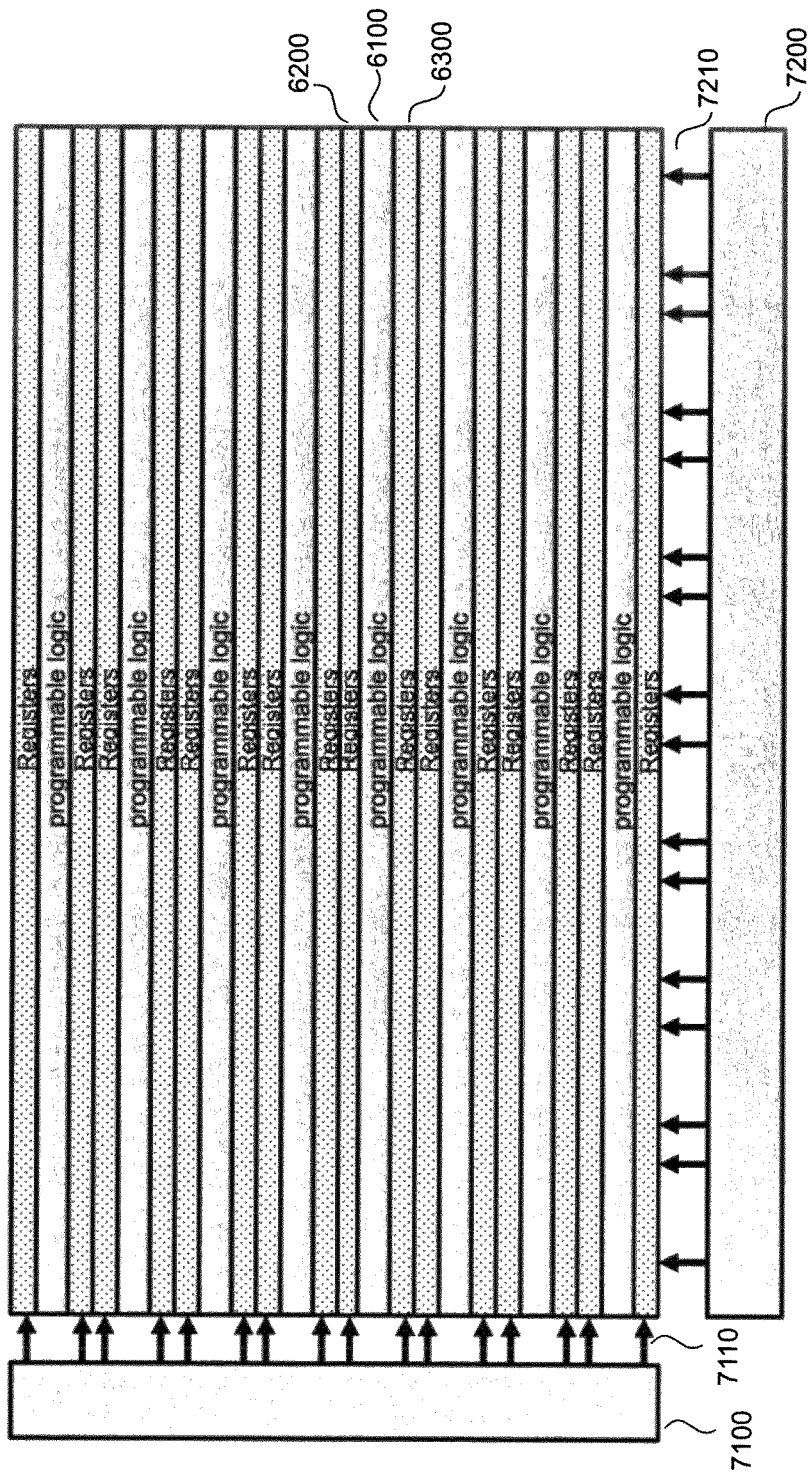
FIG. 7 schematically illustrates a circuit comprising a plurality of look-up tables in accordance with a further embodiment of the present invention.

FIG. 7 schematically illustrates a circuit 7000 comprising a plurality of look-up tables 6000 in accordance with a further embodiment of the present invention.

More specifically, circuit 7000 comprises a plurality of programmable logic 6100, interleaved by registers groups 6200 and/or 6300. Additionally, circuit 7000 comprises a decoder unit 7100 and a data unit 7200.

The decoder unit 7100 is connected to the plurality of registers groups 6200, 6300 via a plurality of connections 7110. Those connections, similar to connection line 6412, provide decode connections for registers groups 6200, 6300.

The data unit 7200 is connected to the plurality of registers groups 6200, 6300 via a plurality of connections 7210. Those connections, similar to connection line 6421, provide data connections for registers groups 6200, 6300.

As a result of such approach, it is possible to arrange a large number of look-up tables 6000 in a compact form, and potentially with the usage of only two metal levels. This allows the remaining metal levels to be used for interconnecting the plurality of programmable logic 6100 between each other. In this manner, more complicated Boolean functions can be realized than with a single look-up table architecture 6000.

Additionally, routing and timing management is simply maintained, owing to the regular structure realized.

Although the present embodiment has been illustrated as a sequence of one programmable logic 6100 interleaved by two registers groups 6200 and 6300, the present invention is not limited thereto. Alternatively, or in addition, the circuit 7000 could comprise a plurality of programmable logic 6100 interleaved by only one registers group 6200, 6300.

Still alternatively, or in addition, the sequence of programmable logics and registers group could comprise a first register group issuing register signals for a first programmable logic, and the first programmable logic, a second programmable logic and a second register group issuing register signals for the second programmable logic. In particular, this could be advantageous if, for instance, the first and second programmable logics were placed in a horizontally symmetrical manner so as to share a common connection to low voltage power supply 1022. A similar placement could be realized for registers groups 6200 and 6300, so as to share a common power supply connection.

Figure 8:
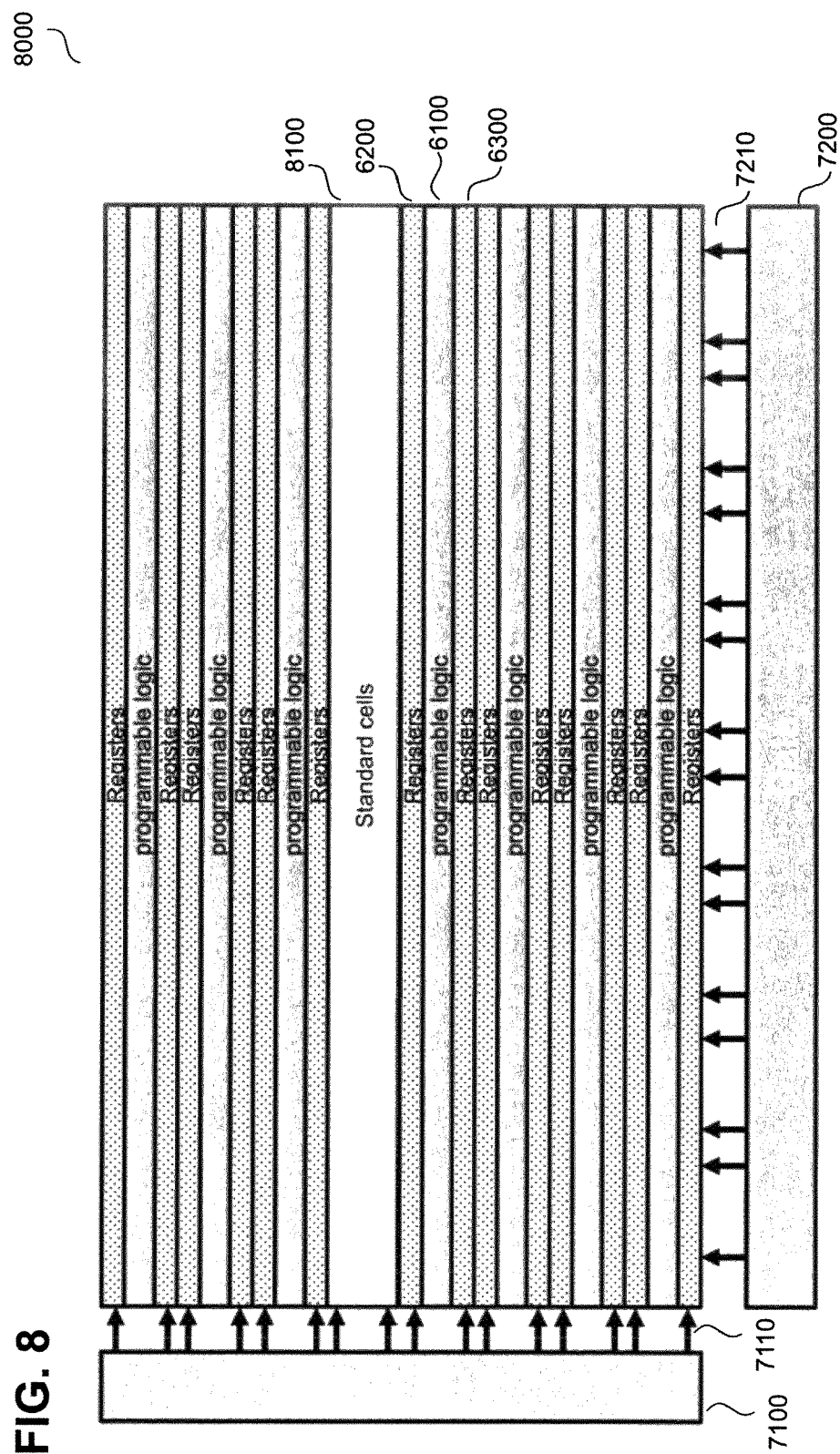
FIG. 8 schematically illustrates a circuit comprising a plurality of look-up tables 6000 in accordance with a further embodiment of the present invention.

FIG. 8 schematically illustrates a circuit 8000 comprising a plurality of look-up tables 6000 in accordance with a further embodiment of the present invention.

More specifically, circuit 8000 differs from circuit 7000 of FIG. 7 due to the presence of a standard cell block 8100. Standard cell block 8100 is placed between two look-up tables 6000 and can be connected to any look-up table of circuit 8000 via any metal level. Advantageously, since metal levels 1 and 2 can be used for the routing of the look-up tables, the same metal level layers can be reserved for the internal routing of the standard cell block 8100, while the remaining metal levels can be used to interconnect the standard block cell 8100 with any of the look-up tables 6000, or with any other node in circuit 8000.

In particular, standard cell block 8100 can be realized by using the teaching disclosed in Patent Document European Patent Application EP 2 333 833 A1. This is advantageous since the standard cells disclosed in the document can be regularly arranged in the form of rows. Such a regular placement for standard cell block 8100, in addition to the regular placement for the look-up tables 6000, provides a compact, yet dense layout.

Furthermore, a regular arrangement as described above allows a regular placement of power supply nodes, which results in a simplified management of voltage drop over the layout's surface.

Additionally, since standard cell block 8100 can be interleaved with look-up tables 6000, it is possible to realize the logic functions close to the relevant programmable logic of the look-up table, resulting in an increased speed of operation and reduced power consumption, due to the reduced routing.

Although in the present embodiment only one standard cell block 8100 has been illustrated, the present invention is not limited thereto. In particular, any number of standard cell blocks 8100 can be arranged with any number of look-up tables 6000.

Although several embodiments have been described, they are not to be considered independently. In particular, features from different embodiments can be combined within the scope of the invention as defined by the claims.

The invention claimed is:

1. A semiconductor circuit having a look-up table architecture comprising:
    a registers group comprising a plurality of registers configured to issue register signals; and
    a programmable logic comprising a plurality of pass gates configured to be controlled at least by the register signals, the registers group and the programmable logic forming a modular look-up table, wherein:
        all of the pass gates of the plurality of pass gates are arranged in three or more regions, wherein the three or more regions are co-linear along a first shared line;
        the number of pass gates in each of the three or more regions being the same among all the three or more regions; and
        all of the pass gates of each region of the three or more regions are co-linear along a second shared line, and
    wherein the first shared line and the second shared line intersect.

2. The semiconductor circuit according to claim 1, wherein each pass gate of the plurality of pass gates is placed on a position substantially aligned with a respective register of the plurality of registers issuing a respective register signal controlling the pass gate.

3. The semiconductor circuit according to claim 2, wherein the registers of the plurality of registers are placed in a staggered manner on two sides of the programmable logic.

4. The semiconductor circuit according to claim 2, further comprising a plurality of register groups and a plurality of programmable logics forming a plurality of look-up tables, wherein the plurality of look-up tables are located next to each other such that any programmable logic is separated from neighboring programmable logic by at least one register group.

5. The semiconductor circuit according to claim 4, further comprising at least one standard cell block comprising a plurality of standard cells, wherein the standard cell block is located along at least one look-up table and/or at least one register group.

6. The semiconductor circuit according to claim 1, wherein the registers of the plurality of registers are placed on one side of the programmable logic.

7. The semiconductor circuit according to claim 1, wherein the registers of the plurality of registers are placed in a staggered manner on two sides of the programmable logic.

8. The semiconductor circuit according to claim 1, further comprising a plurality of register groups and a plurality of programmable logics forming a plurality of look-up tables, wherein the plurality of look-up tables are located next to each other such that any programmable logic is separated from neighboring programmable logic by at least one register group.

9. The semiconductor circuit according to claim 1, further comprising at least one standard cell block comprising a plurality of standard cells, wherein the standard cell block is located along at least one look-up table and/or at least one register group.

10. The semiconductor circuit according to claim 1, further comprising:
a decoder unit configured to select one or more of the plurality of registers; and
a data unit configured to set a value within registers of the plurality selected by the decoder unit.

11. The semiconductor circuit according to claim 1, further comprising:
a first metal level configured to realize connections to internal nodes of the programmable logic and/or decode connections for the registers group and/or power connections for the registers group, and
a second metal level configured to realize data connections for the registers group.

12. The semiconductor circuit according to claim 1, wherein at least one of the plurality of pass gates comprises a double gate transistor having a first gate and a second gate.

13. The semiconductor circuit according to claim 12, wherein:
the double gate transistor is an SOI transistor having a top gate and a bottom gate; and
the first gate is the top gate, and the second gate is the bottom gate.

14. The semiconductor circuit according to claim 12, wherein the double gate transistor is a FINFET having at least two independent gates.

15. The semiconductor circuit according to claim 1, wherein the semiconductor circuit comprises an FPGA.

16. The semiconductor circuit according to claim 1, wherein the registers of the plurality of registers are placed on one side of the programmable logic.

17. The semiconductor circuit according to claim 1, wherein the look-up table architecture further comprises an output node, a high-voltage power supply node, and a low voltage power supply node, and wherein the output node is driven by the high voltage power supply node or the low voltage power supply node and not by a register of the plurality of registers.

18. The semiconductor circuit according to claim 17, wherein each register of the plurality of registers is only connected to a capacitive load.

19. The semiconductor circuit of claim 1, wherein all of the three or more regions are arranged in a rectangular layout.

20. A semiconductor circuit having a look-up table architecture comprising:
a registers group comprising a plurality of registers configured to issue register signals; and
a programmable logic comprising a plurality of pass gates configured to be controlled at least by the register signals, the registers group and the programmable logic forming a modular look-up table, wherein:
all of the pass gates of the plurality of pass gates are arranged in co-linear regions;
the number of pass gates in each of the co-linear regions being the same; and
all of the pass gates of each of the regions are co-linear along a shared line.

* * * * *